(12) United States Patent
Ohno

(10) Patent No.: US 8,436,461 B2
(45) Date of Patent: May 7, 2013

(54) SEMICONDUCTOR DEVICE

(75) Inventor: Hirotaka Ohno, Miyoshi (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 13/499,253

(22) PCT Filed: May 21, 2010

(86) PCT No.: PCT/JP2010/058586
§ 371 (c)(1),
(2), (4) Date: Mar. 29, 2012

(87) PCT Pub. No.: WO2011/145202
PCT Pub. Date: Nov. 24, 2011

(65) Prior Publication Data
US 2012/0181685 A1    Jul. 19, 2012

(51) Int. Cl.
*H01L 23/48* (2006.01)
*H01L 23/52* (2006.01)

(52) U.S. Cl.
USPC ........... 257/692; 257/703; 257/739; 257/746; 257/E23.01; 257/E23.018

(58) Field of Classification Search ............. 257/692, 257/703, 739, 746, E23.01, E23.018
See application file for complete search history.

(56) References Cited

U.S. PATENT DOCUMENTS
8,203,218 B2 * 6/2012 Kim .............................. 257/783

FOREIGN PATENT DOCUMENTS

| JP | 03-280452 A | 12/1991 |
| JP | 06-112390 A | 4/1994 |
| JP | 2002-289739 A | 10/2002 |
| JP | 2003-124406 A | 4/2003 |
| JP | 2003-188318 A | 7/2003 |
| JP | 3748849 B2 | 12/2005 |
| JP | 2006-319146 A | 11/2006 |
| JP | 2007-258587 A | 10/2007 |
| JP | 2009-026953 A | 2/2009 |

OTHER PUBLICATIONS

International Search Report of PCT/JP2010/058586 mailed Jul. 13, 2010.

* cited by examiner

*Primary Examiner* — Tu-Tu Ho
(74) *Attorney, Agent, or Firm* — Kenyon & Kenyon LLP

(57) ABSTRACT

Disclosed is a semiconductor device wherein the adhesion of resin to a substrate is improved at a low cost. A semiconductor element and one or two substrates opposing one or both of the surfaces of the semiconductor element are sealed by a resin, a resin bonding coat which is formed by spraying a metal powder by a cold spray method is formed on one or both of the substrates, and recess portions which are widened from a film surface in a depth direction are formed on the resin bonding coat.

16 Claims, 5 Drawing Sheets

SEMICONDUCTOR DEVICE

CROSS-REFERENCE TO RELATED APPLICATIONS

This is a 371 national phase application of PCT/JP2010/058586 filed on 21 May 2010, the entire contents of which are incorporated herein by reference.

TECHNICAL FIELD

The present invention relates to a semiconductor device provided at low cost with improved bonding strength (contact strength) between a substrate and a sealing resin.

BACKGROUND ART

A semiconductor device is configured such that a semiconductor element is bonded to a substrate through solder and further this assembly is entirely sealingly covered with resin. The substrate however has a large coefficient of linear expansion, resulting in a problem with peel-off of the sealing resin due to hot/cold cycle environments. As a known technique to prevent such peel-off, therefore, there is coating of polyamide resin or polyimide resin to a substrate. As another technique, Patent Document 1 listed below discloses forming a sprayed coat made of aluminum (Al) or silicon oxides ($Al_2O_3$, $SiO_2$) on a substrate. The substrate covered with the sprayed coat is firmly bonded to the sealing resin part. Further, Patent Document 2 discloses that a plurality of recesses are formed in a surface of a substrate by punching process using a punch having a plurality of protrusions so that sealing resin filled in each recess is hooked with the substrate to enhance bonding strength therebetween.

RELATED ART DOCUMENTS

Patent Documents

Patent Document 1: JP 6(1994)-112390A
Patent Document 2: JP2007-258587A

DISCLOSURE OF THE INVENTION

Problems to be Solved by the Invention

However, such coating of polyamide resin or polyimide resin results in high material cost. In case the resin adheres to a region not targeted for coating, an additional work such as cleaning is needed later, which is troublesome. On the other hand, thermal spray coating is conducted by melting metal powder such as aluminum and then spraying the molten metal onto a substrate. During the spray coating, the substrate is largely influenced by heat. Further, spraying is performed in a chamber under greatly reduced pressure or the like, and thus high costs are needed to form a coat. The price of a semiconductor device is consequently increased. Since the substrate is heated by the heat of molten powder, a troublesome work such as cooling has to be conducted after the coating. Further, during mechanical forming of the recesses, the substrate is distorted by the punching process and thus any recesses could not be formed in close vicinity to the semiconductor element.

The present invention has been made to solve the above problems and has a purpose to provide a semiconductor device with improved bonding strength of resin to a substrate at low cost.

Means of Solving the Problems

To achieve the above purpose, one aspect of the invention provides a semiconductor device in which a semiconductor element and one or two substrates placed to face one or both surfaces of the semiconductor element are sealingly covered with resin, wherein the one substrate or the two substrates are formed with a resin bonding coat in such a manner that metal powder is sprayed on the substrate or substrates by a cold spray method, so that the resin bonding coat is formed with a recess having a space being wider in a deep part in a depth direction than in a coat surface part.

In the above semiconductor device, preferably, the recess has a stepped shape.

In the above semiconductor device, preferably, the substrates are a first electrode and a second electrode placed on both surfaces of the semiconductor electrode, and a block electrode is placed between the semiconductor element and the first electrode, the block electrode being formed on the first electrode by the cold spray method.

Further, in the above semiconductor device, preferably, the recess includes a plurality of holes arranged around the semiconductor element and the block electrode.

In the above semiconductor device, preferably, the recess includes a groove surrounding the semiconductor element and the block electrode.

In the above semiconductor device, preferably, the recess includes a groove surrounding the semiconductor element and the block electrode and a rectangular hole overlapping the groove and having a larger dimension than a width of the groove.

Effects of the Invention

According to the present invention, the resin bonding coat is formed on the substrate, the sealing resin is adhered to the resin bonding coat, and further the resin bonding coat gets into the recesses to enhance bonding strength between the substrate and the sealing resin against a stress that attempts to peel off the sealing resin from the substrate. Further, the resin bonding coat formed by the cold spray method is porous and thus has an irregular surface with projections and depressions, so that the sealing resin having been filled in such depressions can also enhance bonding strength. Accordingly, since enhancement of the bonding strength can be achieved by the resin bonding coat, it is possible to eliminate the coating of polyamide resin and others and the forming of a sprayed coat such as aluminum, which are conventionally adopted. Thus, a reduced material cost, improved productivity, and others can results in cost reduction of the semiconductor device.

DESCRIPTION OF THE REFERENCE SIGNS

Figure 1:
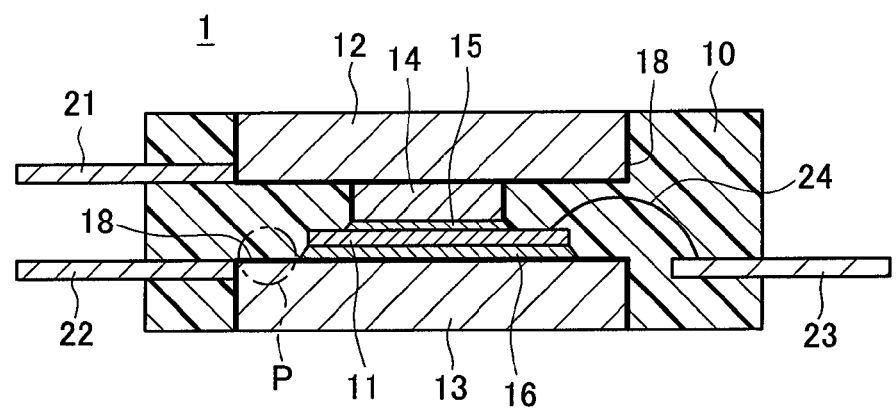
FIG. 1 is a cross sectional view of an embodiment of a semiconductor device.

1 Semiconductor device
10 Resin
11 Semiconductor element
12 First electrode
13 Second electrode
14 Block electrode
15, 16 Solder layer
18 Resin bonding coat
101 Anchor portion
181 Recess

MODE FOR CARRYING OUT THE INVENTION

A detailed description of a preferred embodiment of embodying the present invention will now be given referring to the accompanying drawings. FIG. 1 is a cross sectional view showing a semiconductor device of the present embodiment. This semiconductor device 1 is configured such that a semiconductor element 11 is held between a first electrode 12 and a second electrode 13, and further a block electrode 14 is placed between the semiconductor element 11 and the first electrode 12. The first electrode 12 and the second electrode 13 are provided as an emitter electrode or a collector electrode which are main electrodes of the semiconductor element 11, and also function as heat sink or dissipating plates. Those electrodes 12 and 13 are therefore made of metal providing good electric conductivity and heat conductivity, such as copper and aluminum.

On the other hand, the block electrode 14 is integrally formed on the first electrode 12 by a cold spray method. A solder layer 15 is provided between the semiconductor element 11 and the block electrode 14 to bond them and a solder layer 16 is provided between the semiconductor element 11 and the second electrode 13 to bond them. Main electrode terminals 21 and 22 are connected respectively to the first electrode 12 and the second electrode 13. A control electrode terminal 23 is connected to the semiconductor element 11 through a bonding wire 24. Those components are wholly sealingly covered with sealing resin 10. The first electrode 12 and the second electrode 13 are examples of a substrate recited in claims and are formed, on their surfaces, with resin bonding coats 18 by the cold spray method.

Figure 2:
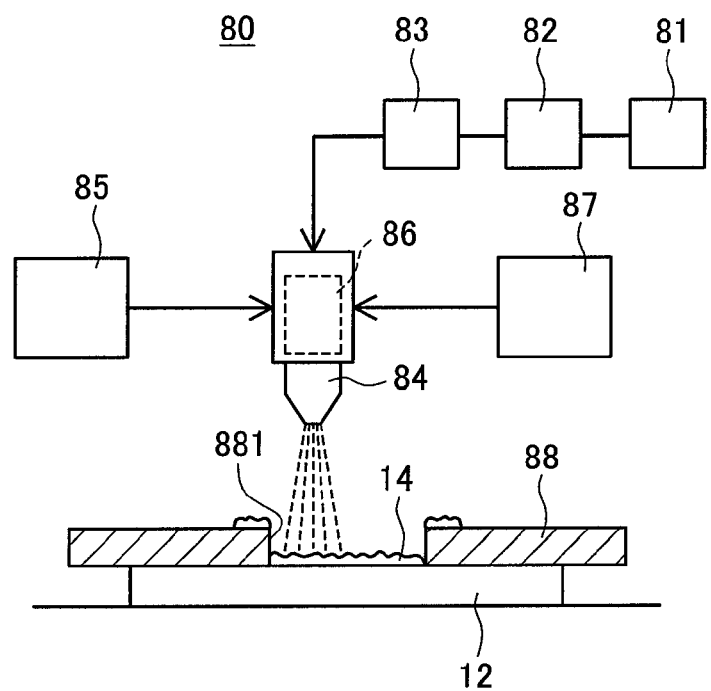
FIG. 2 is a conceptual diagram showing a coating device used in a cold spray method.

FIG. 2 is a conceptual diagram showing a structure of a coating device to be used in the cold spray method. A coating device 80 includes a compressor 81 for supplying compressed gas. This compressed gas supplied from the compressor 81 is heated in a heating unit 82 and then injected from a nozzle 84 via a pressure regulating valve 83. A powder tank 85 stores for example copper powder. The nozzle 84 is provided with a heater 86 to further heat the copper powder fed from the powder tank 85 into the nozzle 84. A drive unit 87 is provided to move the nozzle 84 in parallel in order to spray the copper powder onto a specified region to form a coat or film thereon.

When the block electrode 14 is to be formed by the coating device 80, a mask 88 is placed on the first electrode 12. This mask 88 includes an open frame 881 having a dimension corresponding to the region to be coated. The open frame 881 is disposed in place on the first electrode 12. Copper powder having average particle diameter of 5 to 60 μm is supplied from the powder tank 85 to the nozzle 84. The copper powder is heated by the heater 86. Further, the compressed gas supplied from the compressor 81 and then heated is supplied into the nozzle 84.

The copper powder in a solid phase state having been heated to 50° C. to 200° C. is sprayed swiftly together with the compressed gas onto the surface of the first electrode 12 through the nozzle 84. A jet of copper powder in a solid state from the nozzle 84 collides against the first electrode 12 at high velocities ranging from acoustic velocity to supersonic velocity, so that the copper powder is plastically deformed, sticking to the first electrode 12, thereby forming a coat thereon. When the copper powder collides, kinetic energy transforms into heat energy. Therefore, powder surfaces exceed a melting point depending on the kinds of materials and bond to the first electrode 12, thereby providing high bonding or adhesion strength. By repeating the horizontal movement of the nozzle 84 to spray the copper powder all over the region to be coated, the block electrode 14 with a predetermined thickness is formed on the first electrode 12.

The following explanation is given to forming of the resin bonding coat 18 using the cold spray method with respect to the surfaces of the first electrode 12 and the second electrode 13. Conventionally, peel-off of the sealing resin 10 has been regarded as resulting from hot/cold cycle environments. Furthermore, it is revealed this time that, in a resin sealing or covering step for the semiconductor device 1, hardening shrinkage of epoxy resin that shrinks in volume by cross-linking reaction when the resin is hardened at high temperatures and thermal shrinkage of epoxy resin that shrinks when the resin is cooled from the hardening high temperature to a room temperature add up to a large stress that attempts to peel off the resin from the electrodes 12 and 13.

In particular, in a power card configured to cool both sides like the semiconductor device 1 having the large electrodes 12 and 13, two electrodes 12 and 13 are spaced at a fixed distance by the block electrode 14 and sealing resin 10 is filled therebetween. When the sealing resin 10 hardens and shrinks between the electrodes 12 and 13, the electrodes placed on both surfaces to face each other attempt to come close to each other so as to shorten an interval therebetween, but the block electrode 14 placed therebetween prevents their approaching. At that time, stress inducing peel-off of the sealing resin 10 acts on bonding boundary surfaces of the resin 10 and the electrodes 12 and 13 and thus the resin 10 is peeled from the electrodes 12 and 13 due to lack of sufficient bonding strength.

Figure 3:
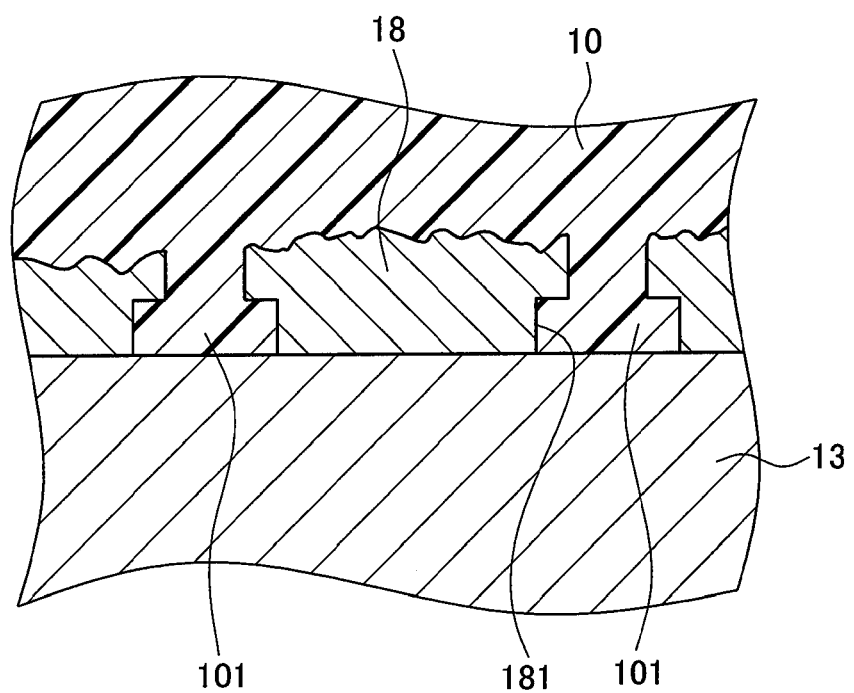
FIG. 3 is an enlarged cross sectional view of a part P in FIG. 1, showing a boundary portion between a second electrode and sealing resin.

In the semiconductor device 1, therefore, resin bonding coats 18 for high bonding strength are formed on boundary surfaces of the first electrode 12 and the second electrode 13 with respect to the sealing resin 10. FIG. 3 is an enlarged cross sectional view showing a part P of FIG. 1, which is a boundary portion between the second electrode 13 and the sealing resin 10. The resin bonding coat 18 is made by the cold spray method and particularly is formed with recesses 181 which are spaces or voids for receiving the sealing resin 10. Each of the recesses 181 is formed so that a space is wider in a deep part in a depth direction than in a coat surface part. To be concrete, each recess 181 has a stepped shape being narrower on an open surface side, providing a shoulder, so that an anchor portion 101 of the sealing resin 10 having got into and hardened in the recess 181 is hooked on the shoulder without coming off.

Figure 4:
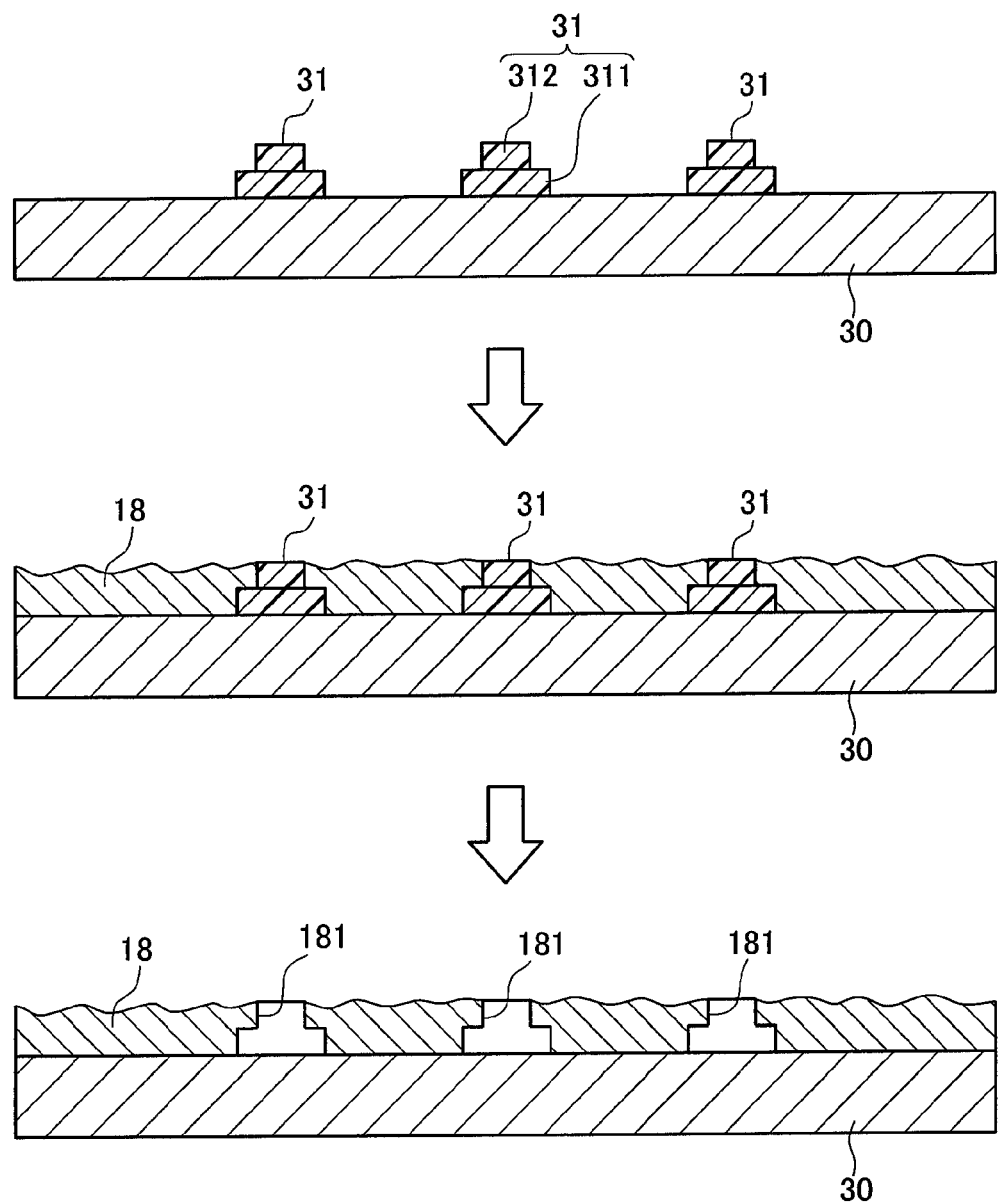
FIG. 4 is a conceptual diagram showing a process of forming a resin bonding coat.

FIG. 4 is a conceptual diagram showing a process of forming the resin bonding coats 18. Forming the resin bonding coats 18 are conducted by first forming two-tiered resist blocks 31 to create spaces or voids for the recesses 181 in a substrate 30 to be used as the first electrode 12 or the second electrode 13. For instance, a photolithographic method is adopted, in which photoresist is applied on the substrate 30 and then an ultraviolet ray is irradiated onto the substrate 30 from above a mask. Thereby, the photoresist of a chemically-changed portion is melted, forming a resist block 31. Each resist block 31 is formed of a lower-tier block 311 and an upper-tier block 312 is formed in order so that the lower-tier block 311 has a larger area than the upper-tier block 312.

After the resist blocks 31 are formed, the resin bonding coat 18 is formed by the cold spray method using the aforementioned coating device 80. Specifically, copper powder is sprayed onto the substrate 30 to form thereon the resin bonding coat 18 of a predetermined thickness so that the resist blocks 31 are embedded in the coat 18. Thereafter, the resist blocks 31 embedded in the coat 18 are removed by an ashing treatment using oxygen plasma and others. Furthermore, the substrate 30 is subjected to cleaning using a solution such as an acid solution to remove impurities such as metal or organic matters. In the coat 18 from which the resist blocks 31 have been removed in the above way, recesses 181 are formed, each being wider in the deep part in the depth direction than in the open surface part.

Figure 5:
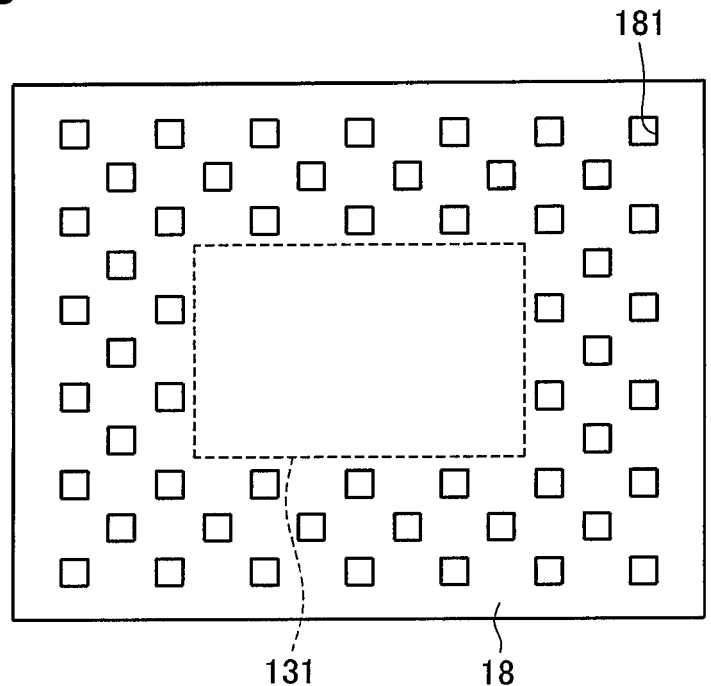
FIG. 5 is a plan view showing another example of the resin bonding coat, with recesses shaped as holes.
Figure 6:
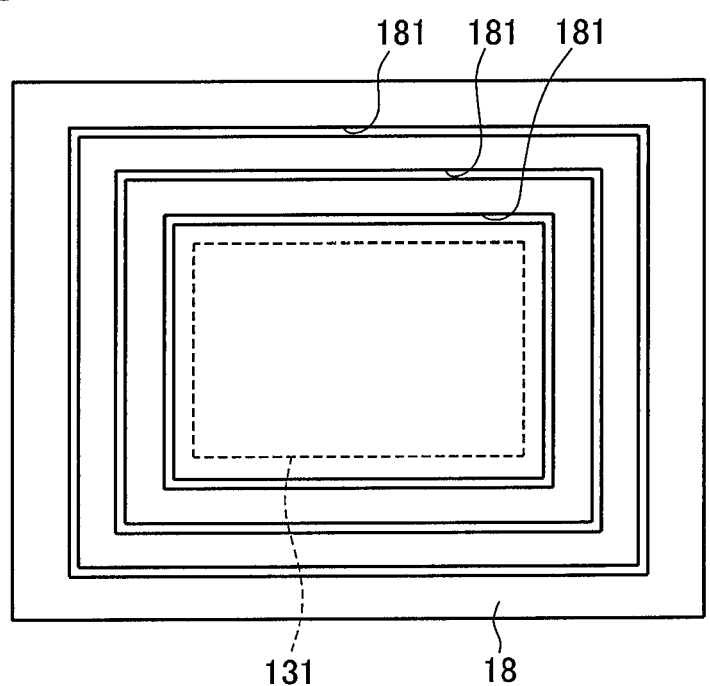
FIG. 6 is a plan view showing another example of the resin bonding coat, with recesses shaped as grooves.
Figure 7:
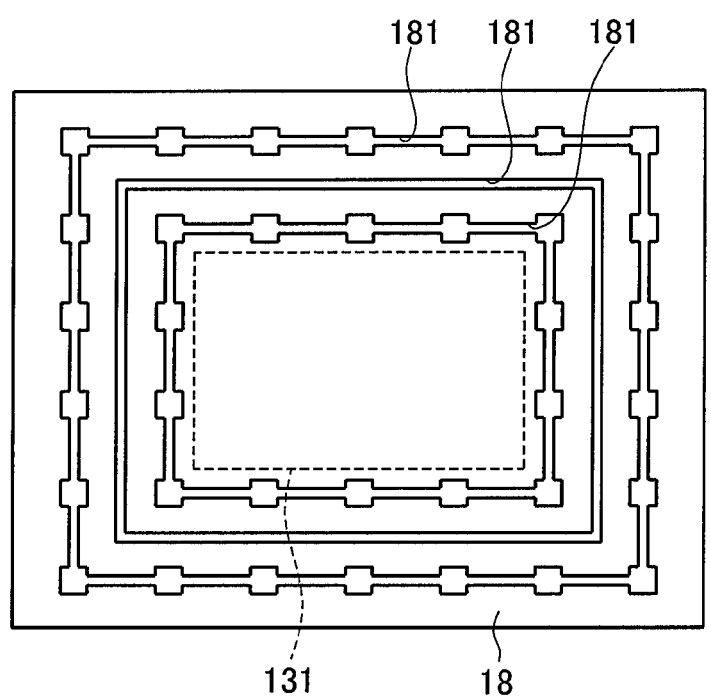
FIG. 7 is a plan view showing another example of the resin bonding coat, with recesses shaped as holes and grooves in combination.

Meanwhile, the resin bonding coats 18 provided on the first electrode 12 and the second electrode 13 of the semiconductor device 1 are each formed with the recesses 181 arranged around the semiconductor element 11 and the block electrode 14 to be placed at the centers of the coats 18. FIGS. 5 to 7 are plan views showing pattern variations of the recesses formed in the resin bonding coat 18 of the second electrode 13. One example of the recesses 181 is a rectangular hole shown in FIG. 5. Specifically, a plurality of the holes are arranged to surround a bonding region 131 on which the semiconductor element 11 is to be bonded. Another example of the recesses 181 may be provided as a plurality of grooves arranged to surround the bonding region 131 as shown in FIG. 6. Further another example of the recesses 181 may also be provided as annular grooves surrounding the bonding region 131 in combination with rectangular holes each having a larger dimension than the groove width, as shown in FIG. 7.

In the semiconductor device 1 shown in FIG. 1, as mentioned above, the resin bonding coat 18 is formed the surface of each of the first electrode 12 and the second electrode 13 and the sealing resin 10 adheres to the resin bonding coat 18 as shown in FIG. 3. In particular, the anchor portions 101 filled in the recesses 181 enhance bonding strength of the sealing resin 10 against the stress that attempts to peel off the sealing resin 10. The resin bonding coat 18 formed by the cold spray method is porous and thus has an irregular surface with protrusions and depressions. Accordingly, the sealing resin 10 having got into the recessed portions of the resin bonding coat 18 can contribute to further enhancement of the bonding strength. In this regard, in the semiconductor device 1, the block electrode 14 is similarly formed by the cold spray method. Thus, the sealing resin 10 can provide higher bonding strength with respect to the block electrode 14.

In the case of the resin bonding coat 18 having the hole-shaped recesses 181 as shown in FIG. 5, the sealing resin 10 entering in each hole spreads all around therein and adheres to the coat 18 defining each hole, thus hooking on to the shoulder. Accordingly, the bonding strength of the sealing resin 10 can be enhanced. On the other hand, in the case of the groove-shaped recesses 181 as shown in FIG. 6, the sealing resin 10 entering in each recess 181 flows to every corner of each recess 181. Therefore, the sealing resin 10, pushing air bubbles out of the recesses 181, forms the anchor portions 101 filled with resin, thus ensuring bonding strength. In the case of the recesses 181 each including a groove and holes in combination as shown in FIG. 7, the advantages of the above patterns can be achieved. That is, resin flows in each hole in which air bubbles are apt to stay, thereby pushing the air bubbles into the grooves. Each hole is filled with the resin to thereby form each anchor portion 101 formed as a hook protruding in four directions, thereby enhancing bonding strength.

In the present embodiment, the enhanced bonding strength by the resin bonding coat 18 can eliminate the coating of polyamide resin and others conventionally conducted or the forming of sprayed coat such as aluminum. This can reduce a material cost and enhance productivity. Thus, the cost reduction of the semiconductor device 1 can be realized. Since any distortion resulting from a punching process is not caused in forming the recesses 181, the second electrode 13 allows formation of the recesses 181 near the semiconductor element 11. The resin bonding coat 18 is formed of metal having good thermal conductivity and electrical conductivity, such as aluminum and copper, and therefore can be formed all over the second electrode 13. Accordingly, the bonding strength between the resin bonding coat 18 and the sealing resin 10 can be ensured at a short distance around the semiconductor element 11.

Furthermore, in the case of using the cold spray method, the resin bonding coat 18 can be formed easily and uniformly in three dimensions, allowing direct soldering thereon. When the resin bonding coat 18 is made of copper, nickel, silver, soldering thereto is enabled. Therefore, nickel plating or gold plating conventionally needed for the first and second electrodes 12 and 13 is no longer necessary. Such nickel plating may cause a decrease in bonding strength with the sealing resin. Such gold plating is very expensive. In this respect, the price of the semiconductor device 1 can be reduced.

Furthermore, in the block electrode 14 and the resin bonding coat 18, formed by the cold spray method, a capillary phenomenon comes about in respective surfaces due to their irregularities. With such capillary phenomenon, redundant solder is received in the recesses, preventing excess solder from running out and also preventing the solder from sticking in drops to needless places.

The present invention is not limited to the above embodiment and may be embodied in other specific forms without departing from the essential characteristics thereof.

For instance, FIG. 1 describes the semiconductor device 1 configured to cool both sides. The present invention may be applied to a semiconductor device configured to cool one side, in which an electrode is provided on only one side of a semiconductor element.

For instance, FIGS. 5 and 7 exemplify the rectangular hole as the shape of each recess 181. This shape may be circular or others.

The invention claimed is:

1. A semiconductor device in which a semiconductor element and one or two substrates placed to face one or both surfaces of the semiconductor element are sealingly covered with resin,
    wherein the one substrate or the two substrates are formed with a resin bonding coat in such a manner that metal powder is sprayed on the substrate or substrates by a cold spray method, so that the resin bonding coat is formed with a recess having a space being wider in a deep part in a depth direction than in a coat surface part.

2. The semiconductor device according to claim 1, wherein the recess has a stepped shape.

3. The semiconductor device according to claim 1, wherein the substrates are a first electrode and a second electrode placed on both surfaces of the semiconductor electrode, and a block electrode is placed between the semiconductor element and the first electrode, the block electrode being formed on the first electrode by the cold spray method.

4. The semiconductor device according to claim 1, wherein the recess includes a plurality of holes arranged around the semiconductor element and the block electrode.

5. The semiconductor device according to claim 1, wherein the recess includes a groove surrounding the semiconductor element and the block electrode.

6. The semiconductor device according to claim 1, wherein the recess includes a groove surrounding the semiconductor element and the block electrode and a rectangular hole overlapping the groove and having a larger dimension than a width of the groove.

7. The semiconductor device according to claim 2, wherein the substrates are a first electrode and a second electrode placed on both surfaces of the semiconductor electrode, and a block electrode is placed between the semiconductor element and the first electrode, the block electrode being formed on the first electrode by the cold spray method.

8. The semiconductor device according to claim 2, wherein the recess includes a plurality of holes arranged around the semiconductor element and the block electrode.

9. The semiconductor device according to claim 3, wherein the recess includes a plurality of holes arranged around the semiconductor element and the block electrode.

10. The semiconductor device according to claim 7, wherein the recess includes a plurality of holes arranged around the semiconductor element and the block electrode.

11. The semiconductor device according to claim 2, wherein the recess includes a groove surrounding the semiconductor element and the block electrode.

12. The semiconductor device according to claim 3, wherein the recess includes a groove surrounding the semiconductor element and the block electrode.

13. The semiconductor device according to claim 4, wherein the recess includes a groove surrounding the semiconductor element and the block electrode.

14. The semiconductor device according to claim 2, wherein the recess includes a groove surrounding the semiconductor element and the block electrode and a rectangular hole overlapping the groove and having a larger dimension than a width of the groove.

15. The semiconductor device according to claim 3, wherein the recess includes a groove surrounding the semiconductor element and the block electrode and a rectangular hole overlapping the groove and having a larger dimension than a width of the groove.

16. The semiconductor device according to claim 7, wherein the recess includes a groove surrounding the semiconductor element and the block electrode and a rectangular hole overlapping the groove and having a larger dimension than a width of the groove.

* * * * *